(12) United States Patent
Wilson et al.

(10) Patent No.: US 10,268,324 B2
(45) Date of Patent: *Apr. 23, 2019

(54) PEAK DETECTION SCHEMES FOR TOUCH POSITION DETECTION

(71) Applicant: Parade Technologies, Ltd., Santa Clara, CA (US)

(72) Inventors: Cole Wilson, Everett, WA (US); Jonathan R. Peterson, Everett, WA (US); Dana Olson, Kirkland, WA (US)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 452 days.

This patent is subject to a terminal disclaimer.

(21) Appl. No.: 14/970,445

(22) Filed: Dec. 15, 2015

(65) Prior Publication Data
US 2016/0098127 A1    Apr. 7, 2016

Related U.S. Application Data

(63) Continuation of application No. 13/564,009, filed on Aug. 1, 2012, now Pat. No. 9,213,052.

(51) Int. Cl.
*G01R 27/26* (2006.01)
*G06F 3/044* (2006.01)
*G06F 3/041* (2006.01)
*G06F 3/0354* (2013.01)

(52) U.S. Cl.
CPC .............. *G06F 3/044* (2013.01); *G01R 27/26* (2013.01); *G06F 3/03545* (2013.01); *G06F 3/041* (2013.01); *G06F 3/0416* (2013.01); *G06F 2203/04104* (2013.01)

(58) Field of Classification Search
None
See application file for complete search history.

(56) References Cited

U.S. PATENT DOCUMENTS

| | | | |
|---|---|---|---|
| 5,796,389 A | 8/1998 | Bertram et al. | |
| 5,825,352 A | 10/1998 | Bisset et al. | |
| 7,701,447 B2 | 4/2010 | Lii et al. | |
| 8,564,546 B1 * | 10/2013 | Birch | G06F 3/0416 |
| | | | 178/18.01 |

(Continued)

FOREIGN PATENT DOCUMENTS

WO    WO2010/065328 A2    6/2010

OTHER PUBLICATIONS

Cypress Semiconductor Corporation, International Search Report, PCTUS2012/053486_dated Nov. 20, 2012, 9 pgs.

(Continued)

*Primary Examiner* — Amr A Awad
*Assistant Examiner* — Stephen A Bray
(74) *Attorney, Agent, or Firm* — Morgan, Lewis & Bockius LLP

(57) ABSTRACT

Apparatuses and methods of peak detection are described. One method measures touch data on a sense array, the touch data represented as multiple cells. The method performs multiple different peak-detection schemes on each of the cells to generate a list of one or more possible peaks in the touch data. The method selects one or more actual peaks from the list. The actual peaks are used to determine locations of touches proximate to the sense array.

20 Claims, 10 Drawing Sheets

(56) References Cited

U.S. PATENT DOCUMENTS

| | | |
|---|---|---|
| 8,797,277 B1 | 8/2014 | Grygorenko |
| 8,823,664 B2 | 9/2014 | Kyrynyuk et al. |
| 2009/0207145 A1 | 8/2009 | Tsuzaki et al. |
| 2010/0073318 A1 | 3/2010 | Hu et al. |
| 2010/0090712 A1 | 4/2010 | Vandermeijden |
| 2010/0214232 A1 | 8/2010 | Chan et al. |
| 2010/0265211 A1* | 10/2010 | Oishi ............ G06F 3/044 345/174 |
| 2010/0315372 A1 | 12/2010 | Ng |
| 2011/0025629 A1 | 2/2011 | Grivna et al. |
| 2011/0025638 A1 | 2/2011 | Salaverry et al. |
| 2011/0157055 A1 | 6/2011 | Tilley et al. |
| 2011/0163992 A1 | 7/2011 | Cordeiro et al. |
| 2011/0221701 A1 | 9/2011 | Zhang et al. |
| 2012/0200512 A1* | 8/2012 | Olivier ............ G06F 3/0416 345/173 |
| 2012/0287054 A1* | 11/2012 | Kuo ............ G06F 3/0416 345/173 |
| 2013/0076700 A1* | 3/2013 | Chiu ............ G06F 3/044 345/179 |
| 2013/0106732 A1* | 5/2013 | Chao ............ G06F 3/0416 345/173 |
| 2013/0222047 A1* | 8/2013 | Huang ............ G06F 3/0418 327/517 |

OTHER PUBLICATIONS

Cypress Semiconductor Corporation, International Preliminary Report on Patentability, PCTUS2012/053486_dated Feb. 3, 2015, 8 pgs.

Wilson, Office Action, U.S. Appl. No. 13/564,099, dated Oct. 1, 2014, 15 pgs.

Wilson, Final Office Action, U.S. Appl. No. 13/564,099, dated Apr. 1, 2015, 19 pgs.

Wilson, Notice of Allowance, U.S. Appl. No. 13/564,099, dated Aug. 7, 2015, 16 pgs.

Parade Technologies, Ltd., Certificate of Patent, CN20128001750. X, May 10, 2017, 3 pgs.

* cited by examiner

PEAK DETECTION SCHEMES FOR TOUCH POSITION DETECTION

CROSS REFERENCE TO RELATED APPLICATIONS

This application is a continuation of U.S. patent application Ser. No. 13/564,099, filed Aug. 1, 2012, entitled "Peak Detection Schemes for Touch Position Detection," which is incorporated herein by reference in its entirety.

TECHNICAL FIELD

The present disclosure relates generally to sensing systems, and more particularly to capacitance-sensing systems configured to perform peak detection schemes for touch position detection.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance; 1) mutual capacitance where the capacitance-sensing circuit has access to both electrodes of the capacitor; 2) self capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and Cypress' touch solutions sense both capacitances either uniquely or in hybrid form with its various sense modes.

BRIEF DESCRIPTION OF THE DRAWINGS

The present invention is illustrated by way of example, and not of limitation, in the figures of the accompanying drawings in which:

Figures 8, 9:
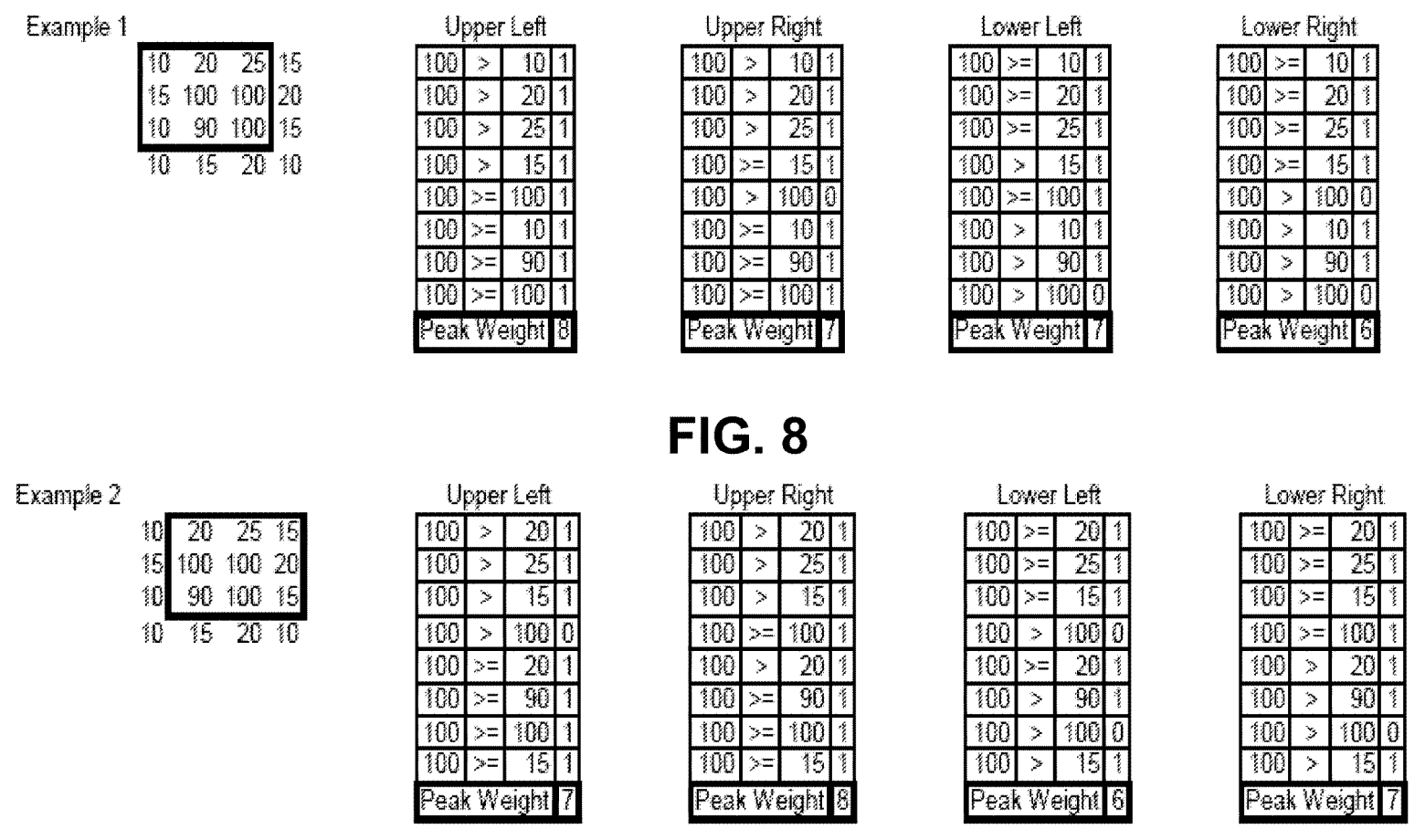

FIG. 8 is a first example of exemplary data to evaluate peak detecting weighting according to one embodiment.

FIG. 9 is a second example of exemplary data to evaluate peak detecting weighting according to another embodiment.

Figures 10, 11:
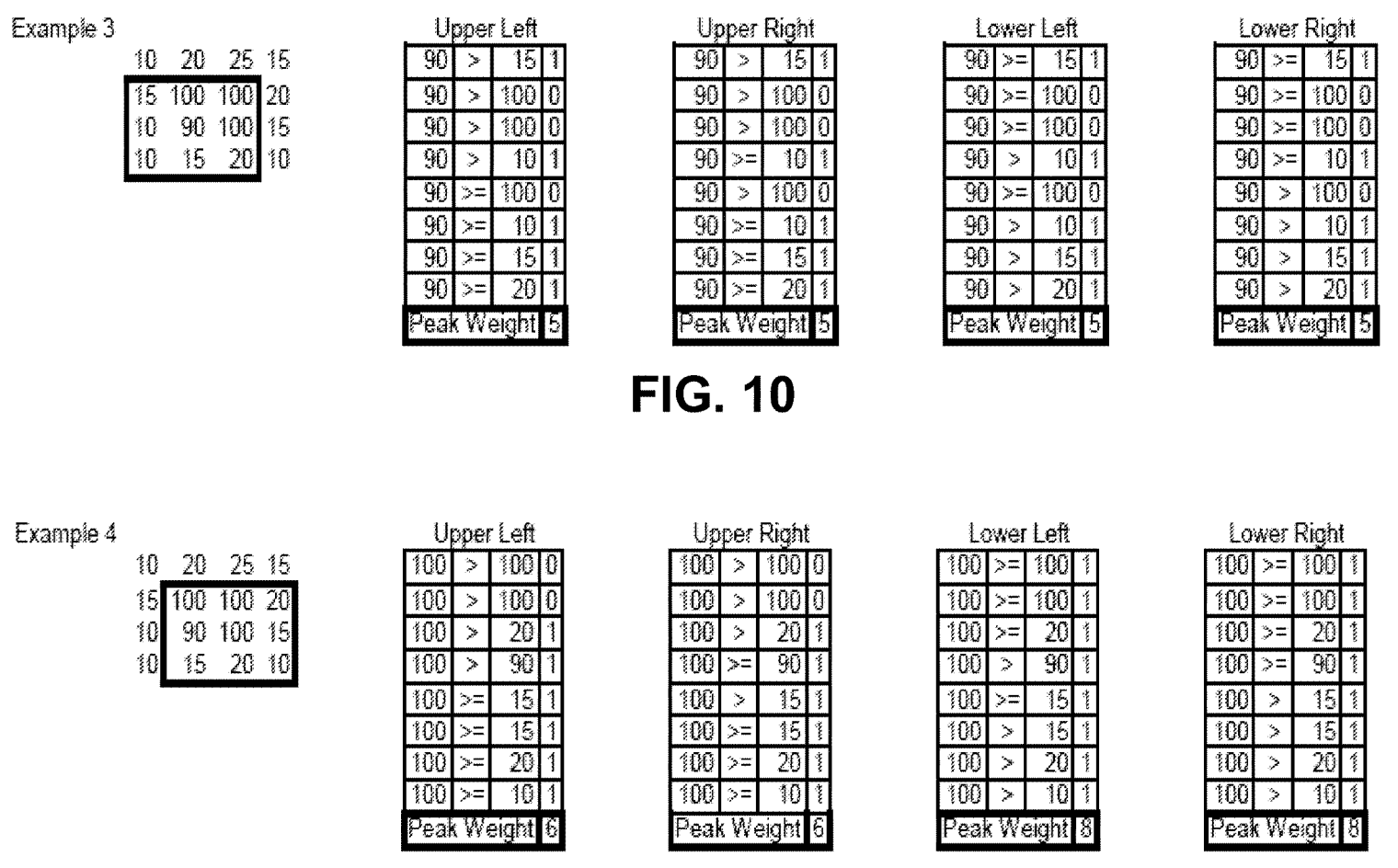

FIG. 10 is a third example of exemplary data to evaluate peak detecting weighting according to another embodiment.

FIG. 11 is a fourth example of exemplary data to evaluate peak detecting weighting according to another embodiment.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Figure 1:
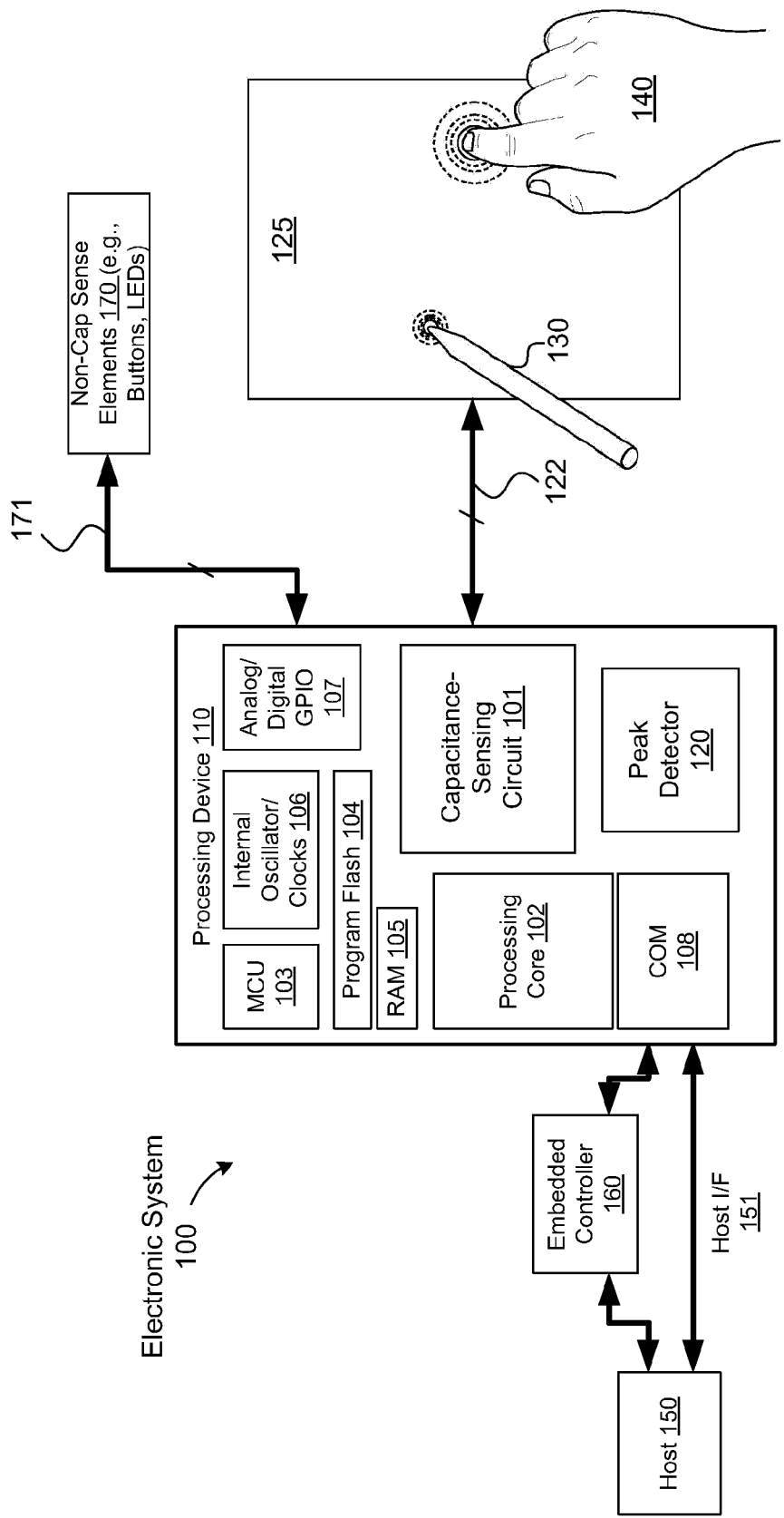
FIG. 1 is a block diagram illustrating one embodiment of an electronic system having a processing device, including a peak detector.

FIG. 1 is a block diagram illustrating one embodiment of an electronic system 100 having a processing device 110, including a peak detector 120. The processing device 110 is configured to detect one or more touches on a touch-sensing device, such as the capacitive sense array 125. The processing device can detect conductive objects, such as touch objects 140 (fingers or passive styluses, an active stylus 130, or any combination thereof. The capacitance-sensing circuit 101 can measure touch data on the capacitive sense array 125. The touch data may be represented as a multiple cells, each cell representing an intersection of sense elements (e.g., electrodes) of the capacitive sense array 125. In another embodiment, the touch data is a 2D capacitive image of the capacitive sense array 125. In one embodiment, when the capacitance-sensing circuit 101 measures mutual capacitance of the touch-sensing device (e.g., capacitive sense array 125), the capacitance-sensing circuit 101 obtains a 2D capacitive image of the touch-sensing device and processes the data for peaks and positional information. In another embodiment, the processing device 110 is a microcontroller that obtains a capacitance touch signal data set, such as from a sense array, and finger detection firmware executing on the microcontroller identifies data set areas that indicate touches, detects and processes peaks, calculates the coordinates, or any combination therefore. The firmware identifies the peaks using the embodiments described herein. The firmware can calculate a precise coordinate for the resulting peaks. In one embodiment, the firmware can calculate the precise coordinates for the resulting peaks using a centroid algorithm, which calculates a centroid of the touch, the centroid being a center of mass of the touch. The centroid may be an X/Y coordinate of the touch. Alternatively, other coordinate interpolation algorithms may be used to determine the coordinates of the resulting peaks. The microcontroller can report the precise coordinates to a host processor, as well as other information.

The peak detector 120 performs multiple different peak-detection schemes on each of the multiple cells to generate a list of one or more possible peaks in the touch data, and selects one or more actual peaks from the list of one or more possible peaks. Each of the one or more actual peaks is used to determine a location of a touch proximate to the capacitive sense array 125. For example, the center of mass of the touches can be determined for the actual peaks determined by the peak detector 120.

In another embodiment, the peak detector 120 obtains a capacitive image of a capacitive sense array 125. The capacitive image includes multiple cells each with a capacitance value of an intersection of sense elements of the sense array 125. It should be noted that the peak detector 120 can receives the raw capacitance value measured by the capacitive-sensing circuit 101 and then compute a difference count, which is a difference between the raw capacitance value and a baseline capacitance value. Alternatively, the capacitance-sensing circuit 101 outputs the difference count to the peak detector 120. The peak detector 120 performs a first set of peak-detection checks for each of the multiple cells using a first peak-detection scheme to identify possible peaks, and performs a second set of peak-detection checks for each of the multiple cells using a second peak-detection scheme to identify additional possible peaks. The peak detector 120 determines which of the possible peaks and additional possible peaks are valid peaks. The valid peaks are used to determine locations of actual touches proximate to the capacitive sense array 125.

In one embodiment, the peak detector 120 is implemented in firmware of the processing device 110. In another embodiment, the peak detector 120 is implemented in software, hardware, or any combination thereof. In another embodiment, the peak detector 120 is implemented as part of a gesture recognition tool that calculates and reports gestures. In another embodiment, the peaks are calculated by the peak detector 120 and sent as raw data to the host processor 150. In another embodiment, the peak detector 120 can be implemented on the host, and the capacitive-sensing circuit 101 obtains the touch data and sends the touch data to the peak detector 120 on the host processor 150. Alternatively, other configurations are possible as would be appreciated by one of ordinary skill in the art having the benefit of this disclosure. It should also be noted that the peaks and precise interpolated coordinates computed from the peaks may be used for gesture recognition in various application. Additional details of the computations by the peak detector 120 are described below with respect to FIGS. 2-12.

The embodiments described herein regarding peak detection can be used to detect two or more touches at minimal finger separation on any senor array pattern. The embodiments described herein take advantage of symmetry of a standard peak-detection algorithm to make a more robust algorithm that uses a voting scheme to determine which peak, if any, are valid. The embodiments described herein can be used for touchscreens, touchpads, or other devices having sensing surfaces.

Electronic system 100 includes processing device 110, capacitive sense array 125, stylus 130, host processor 150, embedded controller 160, and non-capacitive sense elements 170. The capacitive sense elements are electrodes of conductive material, such as copper. The sense elements may also be part of an ITO panel. The capacitive sense elements can be configured to allow the capacitive-sensing circuit 101 to measure self capacitance, mutual capacitance, or any combination thereof. In the depicted embodiment, the electronic system 100 includes the capacitive sense array 125 coupled to the processing device 110 via bus 122. The capacitive sense array 125 may include a multi-dimension capacitive sense array. The multi-dimension sense array includes multiple sense elements, organized as rows and columns. In another embodiment, the capacitive sense array 125 operates as an all-points-addressable ("APA") mutual capacitive sense array. In another embodiment, the capacitive sense array 125 operates as a coupled-charge receiver. In another embodiment, the capacitive sense array 125 is non-transparent capacitive sense array (e.g., PC touchpad). The capacitive sense array 125 may be disposed to have a flat surface profile. Alternatively, the capacitive sense array 125 may have non-flat surface profiles. Alternatively, other configurations of capacitive sense arrays may be used. For example, instead of vertical columns and horizontal rows, the capacitive sense array 125 may have a hexagon arrangement, or the like, as would be appreciated by one of ordinary skill in the art having the benefit of this disclosure. In one embodiment, the capacitive sense array 125 may be included in an ITO panel or a touch screen panel.

The operations and configurations of the processing device 110 and the capacitive sense array 125 for detecting and tracking the touch object 140 and stylus 130 are described herein. In short, the processing device 110 is configured to detect a presence of the touch object 140, a presence of a stylus 130 on the capacitive sense array 125, or any combination thereof. The processing device 110 may detect and track the stylus 130 and the touch object 140 individually on the capacitive sense array 125. In one embodiment, the processing device 110 can detect and track both the stylus 130 and touch object 140 concurrently on the capacitive sense array 125. If the touching object is an active stylus, in one embodiment, the active stylus 130 is configured to operate as the timing "master," and the processing device 110 adjusts the timing of the capacitive sense array 125 to match that of the active stylus 130 when the active stylus 130 is in use. In one embodiment, the capacitive sense array 125 capacitively couples with the active stylus 130, as opposed to conventional inductive stylus applications. It should also be noted that the same assembly used for the capacitive sense array 125, which is configured to detect touch objects 140, is also used to detect and track a stylus 130 without an additional PCB layer for inductively tracking the active stylus 130.

In the depicted embodiment, the processing device 110 includes analog and/or digital general purpose input/output ("GPIO") ports 107. GPIO ports 107 may be programmable. GPIO ports 107 may be coupled to a Programmable Interconnect and Logic ("PIL"), which acts as an interconnect between GPIO ports 107 and a digital block array of the processing device 110 (not shown). The digital block array may be configured to implement a variety of digital logic circuits (e.g., DACs, digital filters, or digital control systems) using, in one embodiment, configurable user modules ("UMs"). The digital block array may be coupled to a system bus. Processing device 110 may also include memory, such as random access memory ("RAM") 105 and program flash 104. RAM 105 may be static RAM ("SRAM"), and program flash 104 may be a non-volatile storage, which may be used to store firmware (e.g., control algorithms executable by processing core 102 to implement operations described herein). Processing device 110 may also include a memory controller unit ("MCU") 103 coupled to memory and the processing core 102.

The processing device 110 may also include an analog block array (not shown). The analog block array is also coupled to the system bus. Analog block array may also be configured to implement a variety of analog circuits (e.g., ADCs or analog filters) using, in one embodiment, configurable UMs. The analog block array may also be coupled to the GPIO 107.

As illustrated, capacitance-sensing circuit 101 may be integrated into processing device 110. Capacitance-sensing circuit 101 may include analog I/O for coupling to an external component, such as touch-sensor pad (not shown), capacitive sense array 125, touch-sensor slider (not shown), touch-sensor buttons (not shown), and/or other devices. The capacitance-sensing circuit 101 may be configured to measure capacitance using mutual capacitance sensing techniques, self capacitance sensing technique, charge coupling techniques or the like. In one embodiment, capacitance-sensing circuit 101 operates using a charge accumulation circuit, a capacitance modulation circuit, or other capacitance sensing methods known by those skilled in the art. In an embodiment, the capacitance-sensing circuit 101 is of the Cypress TMA-3xx, TMA-4xx, or TMA-xx families of touch screen controllers. Alternatively, other capacitance-sensing circuits may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the TX and RX electrodes are configured in rows and columns, respectively. It should be noted that the rows and columns of electrodes can be configured as TX or RX electrodes by the capacitance-sensing circuit 101 in any chosen combination. In one embodiment, the TX and RX electrodes of the sense array 125 are configured to operate as a TX and RX electrodes of a mutual capacitive sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive sense array, instead of measuring a mutual capacitance at an intersection of a RX electrode and a TX electrode (a sense element) as done during mutual capacitance sensing. An intersection between two sense elements may be understood as a location at which one sense electrode crosses over or overlaps another, while maintaining galvanic isolation from each other. The capacitance-sensing circuit 101 does not use mutual capacitance or self-capacitance sensing to measure capacitances of the sense elements when performing a stylus sensing. Rather, the capacitance-sensing circuit 101 measures a charge that is capacitively coupled between the sense array 125 and the stylus as described herein. The capacitance associated with the intersection between a TX electrode and an RX electrode can be sensed by selecting every available combination of TX electrode and RX electrode. When a touch object, such as a finger or stylus, approaches the capacitive sense array 125, the object causes a decrease in mutual capacitance between some of the TX/RX electrodes. In another embodiment, the presence of a finger increases the coupling capacitance of the electrodes. Thus, the location of the finger on the capacitive sense array 125 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more inputs can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art having the benefit of this disclosure. In addition, various types of coordinate interpolation algorithms may be used to detect the center of the touch as would be appreciated by one of ordinary skill in the art having the benefit of this disclosure.

In an embodiment, the electronic system 100 may also include non-capacitive sense elements 170 coupled to the processing device 110 via bus 171 and GPIO port 107. The non-capacitive sense elements 170 may include buttons, light emitting diodes ("LEDs"), and other user interface devices, such as a mouse, a keyboard, or other functional keys that do not use capacitance sensing. In one embodiment, buses 122, and 171 are embodied in a single bus. Alternatively, these buses may be configured into any combination of one or more separate buses.

Processing device 110 may include internal oscillator/clocks 106 and communication block ("COM") 108. In another embodiment, the processing device 110 includes a spread spectrum clock (not shown). The oscillator/clocks block 106 provides clock signals to one or more of the components of processing device 110. Communication block 108 may be used to communicate with an external component, such as a host processor 150, via host interface ("I/F") line 151. Alternatively, processing device 110 may also be coupled to embedded controller 160 to communicate with the external components, such as host processor 150. In one embodiment, the processing device 110 is configured to communicate with the embedded controller 160 or the host processor 150 to send and/or receive data.

Processing device 110 may reside on a common carrier substrate such as, for example, an integrated circuit ("IC") die substrate, a multi-chip module substrate, or the like. Alternatively, the components of processing device 110 may be one or more separate integrated circuits and/or discrete components. In one exemplary embodiment, processing device 110 is the Programmable System on a Chip (PSoC®) processing device, developed by Cypress Semiconductor Corporation, San Jose, Calif. Alternatively, processing device 110 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 110 may also be done in the host.

Capacitance-sensing circuit 101 may be integrated into the IC of the processing device 110, or alternatively, in a separate IC. Alternatively, descriptions of capacitance-sensing circuit 101 may be generated and compiled for incorporation into other integrated circuits. For example, behavioral level code describing the capacitance-sensing circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 101.

It should be noted that the components of electronic system 100 may include all the components described above. Alternatively, electronic system 100 may include some of the components described above.

In one embodiment, the electronic system 100 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition, and numeric keypad operation.

Figure 2:
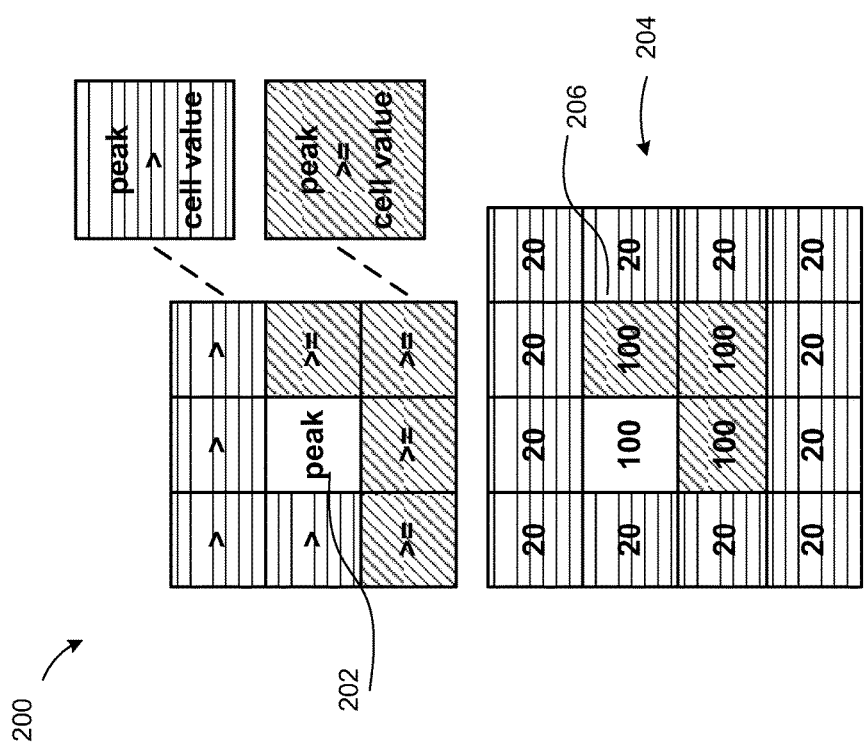
FIG. 2 illustrates a standard peak detection algorithm of a touch according to one embodiment.
Figure 3:
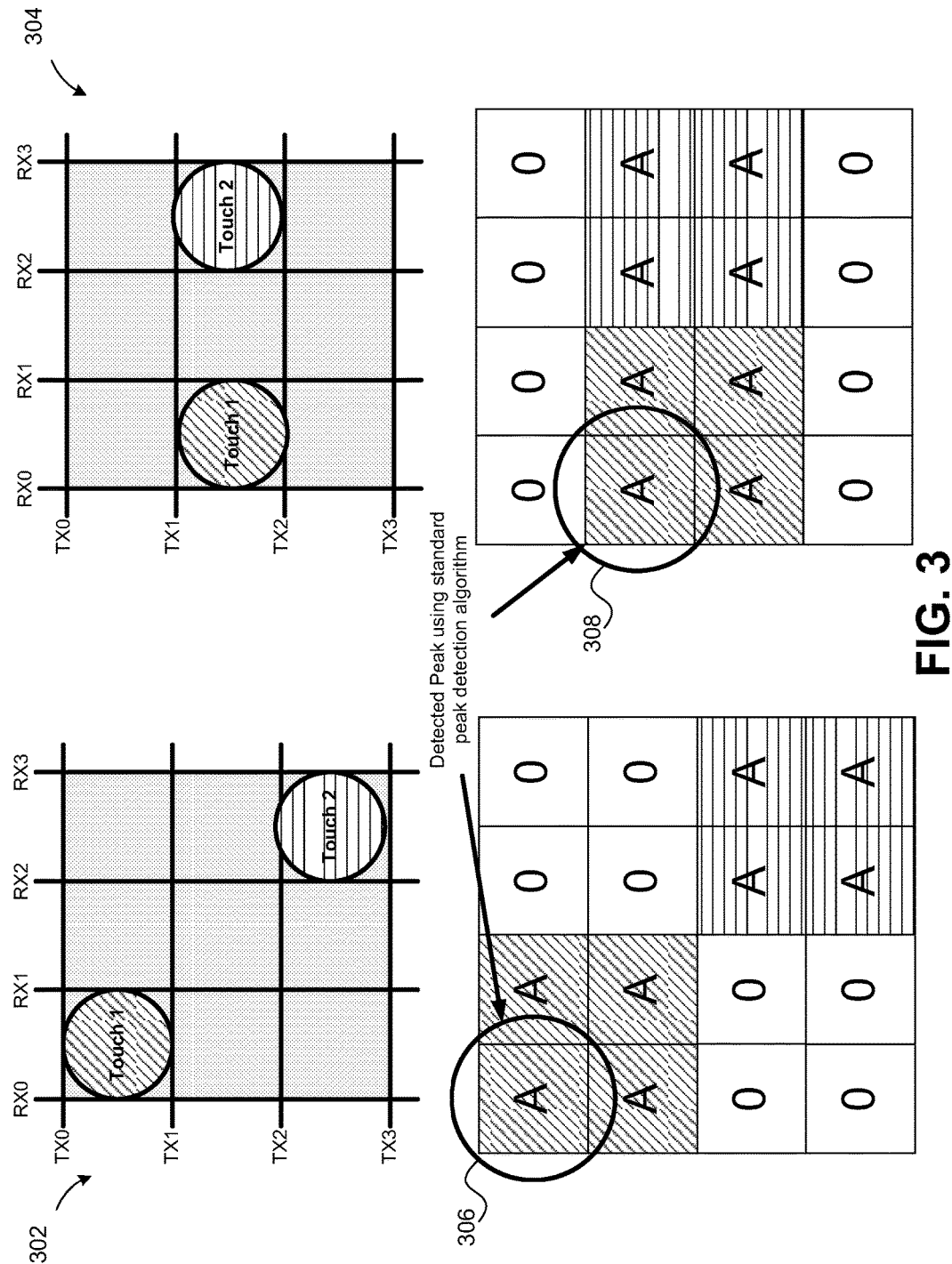
FIG. 3 illustrates two scenarios when the standard peak detection fails according to one embodiment.

FIG. 2 illustrates a standard peak detection algorithm 200 of a touch according to one embodiment. The standard peak-detection algorithm 200 checks each cell value of the array individually to see if it is a peak. In the example, the standard peak-detection algorithm 200 performs a set of peak-detection checks for each cell using a 3×3 window (or 3×3 grid) with the respective center cell 202 (labeled peak) centered in the 3×3 window. The set of peak-detection checks determines if the cell value of the center cell 202 is greater than cell values of a cell to the left of the center cell 202 and of the cells above the center cell, and determines if the cell value of the center cell 202 is greater than or equal to the cell values of a cell to the right of the center cell 202 and of the cells below the center cell 202. However, as seen in the example 204 of FIG. 2, the orientation of the peak-detection checks of "greater than" (">") and "greater than or equal to" (">=") result in a peak being detected in the upper left corner when there are four cells 206 of equal data (e.g., 100). It should be noted that it is possible to get this type of data, for example, if a finger is located directly between four intersections such as illustrated in FIG. 3. This algorithm is susceptible for failure by falsely detecting two touches when there is really just one larger touch on the touch surface. It can also fail when two touches move close together and their difference counts begin to merge into one larger area.

Given the example in FIG. 2, a few cases can be presented where two touches will be detected as a single touch. When this happens, the higher level finger tracking and gesturing algorithms fail. This also causes high accuracy errors because touches may "disappear."

FIG. 3 illustrates two scenarios when the standard peak detection fails according to one embodiment. In particular, FIG. 3 shows two finger locations that fail in a diagonal case 302 and in a horizontal case 304. These are common use cases. For example, pan gestures, rotate gestures, and pitch zoom gestures may result in these scenarios. Both cases 302, 304 in FIG. 3 result in a single touch 306, 308 being detected despite there being two touches on the screen. The value "A" represents a constant value from an analog-to-digital conversion (ADC) measurement of the capacitive value. The actual value of "A" isn't important other than the the cells used in the example are represented to be equal. This is also a common occurrence for two reasons. First, the data from the ADC is quantized. So, small changes may be forced to a single range of values because the entire capacitive space may have a small range for which it can be represented. Secondly, there may be noise on each cell, which may modulate the cells' values. With modulating values, it takes one occurrence of this situation to occur for the touch detection to break and disrupt the user experience.

The standard peak-detection solution's worst case is a touch separation of 2X the diagonal of a sense element pitch (sometimes referred to as sensor pitch). The pitch is defined as the width of the sense elements and the spacing between the sense elements. This distance can be measured from one edge of a sense element to the same edge of the next element. The distance can also be measured from center of one of the sense elements to the center of next sense element. The distance can also be measured in other ways as would be appreciated by one of ordinary skill in the art having the benefit of this disclosure. It should also be noted that touch-sensing device may have different pitch sizes on the X and Y axes; thus, two or more values for the sense element pitch can be identified. A touch separation of 2X the diagonal of a sense element pitch for 5 mm sense elements, touches can be placed just above 14 mm apart and still be falsely detected as a single finger. Other finger separations inside this distance being to have a higher possible failure rate. Thus, the user experience, when performing types of gestures using two or more fingers, may be poor when using the standard peak-detection algorithm.

The embodiments described below use the asymmetry of the peak detection routine to generate two or more peak measurements. A second routine is then used to measure and qualify all possible peaks and choose the most likely or "best" peaks from the list of possible peaks as described in more detail below.

Figure 4:
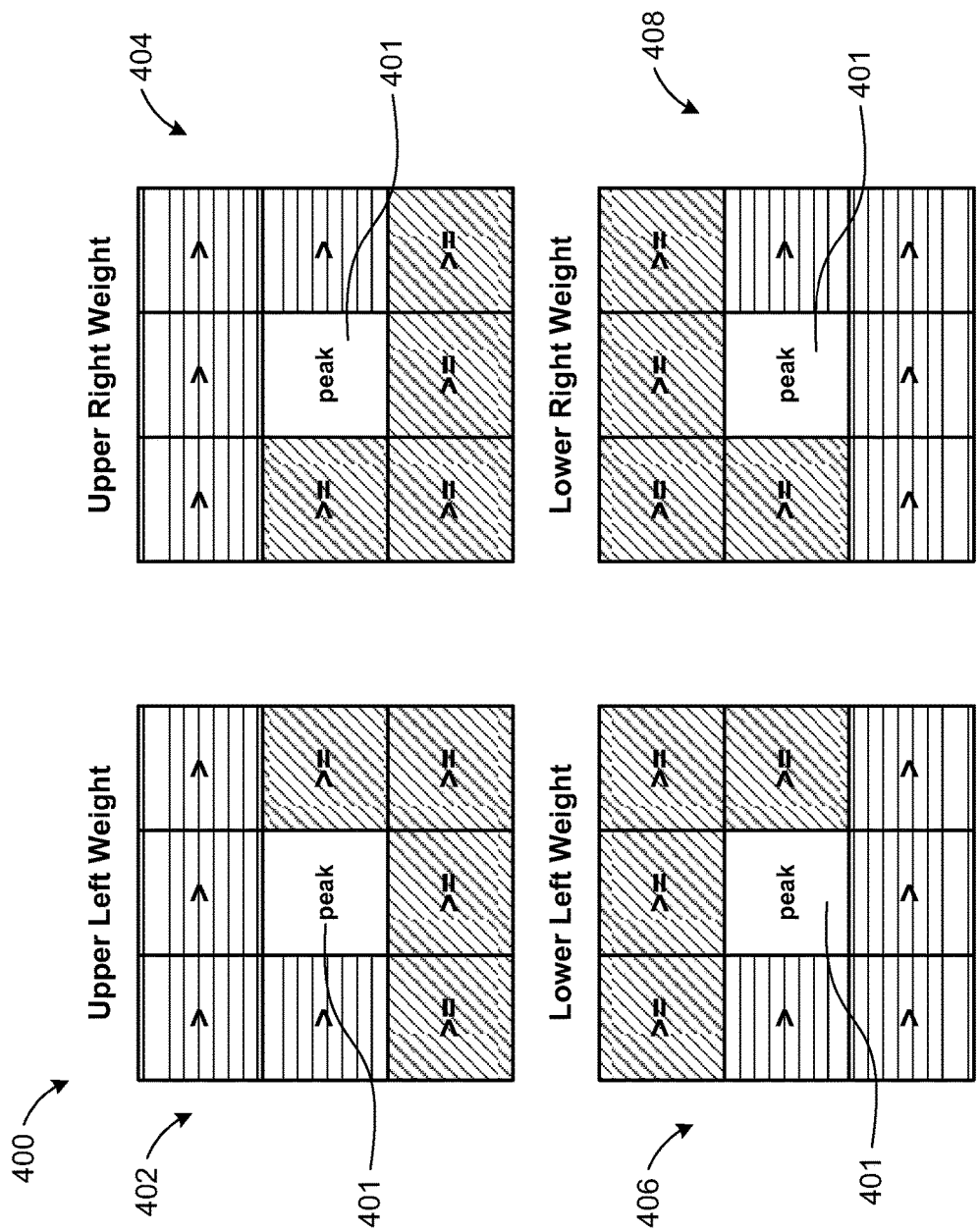
FIG. 4 illustrates a peak-detection weighting algorithm according to one embodiment.

FIG. 4 illustrates a peak-detection weighting algorithm 400 according to one embodiment. The peak-detection weighting algorithm 400 checks each cell value of the array multiple times using multiple peak-detection schemes. For example, the peak-detection weighting algorithm 400 can check each cell using an upper-left-weighting scheme 402, an upper-right-weighting scheme 404, a lower-left-weighting scheme 406 and a lower-right-weighting scheme 408. In this embodiment, the peak-detection weighting algorithm 400 performs a set of peak-detection checks for each cell using a 3×3 window with the respective center cell 401 for the four schemes 402-408.

The set of peak-detection checks for the upper-left-weighting scheme 402 determines if the cell value of the center cell 401 is greater than cell values of a cell to the left of the center cell 401 and of the cells above the center cell 401, and determines if the cell value of the center cell 401 is greater than or equal to the cell values of a cell to the right of the center cell 401 and of the cells below the center cell 401. In the upper-left-weighting scheme 402 of FIG. 4, the orientation of the peak-detection checks of "greater than" (">") and "greater than or equal to" (">=") results in a peak being detected in the upper left corner when there are four cells of equal data.

The set of peak-detection checks for the upper-right-weighting scheme 404 determines if the cell value of the center cell 401 is greater than cell values of a cell to the right of the center cell 401 and of the cells above the center cell 401, and determines if the cell value of the center cell 401 is greater than or equal to the cell values of a cell to the left of the center cell 401 and of the cells below the center cell 401. In the upper-right-weighting scheme 404 of FIG. 4, the orientation of the peak-detection checks of "greater than" (">") and "greater than or equal to" (">=") results in a peak being detected in the upper right corner when there are four cells of equal data.

The set of peak-detection checks for the lower-left-weighting scheme 406 determines if the cell value of the center cell 401 is greater than cell values of a cell to the left of the center cell 401 and of the cells below the center cell 401, and determines if the cell value of the center cell 401 is greater than or equal to the cell values of a cell to the right of the center cell 401 and of the cells above the center cell 401. In the lower-left-weighting scheme 406 of FIG. 4, the orientation of the peak-detection checks of "greater than" (">") and "greater than or equal to" (">=") results in a peak being detected in the lower left corner when there are four cells of equal data.

The set of peak-detection checks for the lower-right-weighting scheme 408 determines if the cell value of the center cell 401 is greater than cell values of a cell to the right of the center cell 401 and of the cells below the center cell 401, and determines if the cell value of the center cell 401 is greater than or equal to the cell values of a cell to the left of the center cell 401 and of the cells above the center cell 401. In the lower-right-weighting scheme 408 of FIG. 4, the orientation of the peak-detection checks of "greater than" (">") and "greater than or equal to" (">=") results in a peak being detected in the lower right corner when there are four cells of equal data.

FIG. 4 shows the peak-detection weighting algorithm 400 used to get a peak weighted in any of four possible corners of the 3×3 grid. The idea is that for diagonally oriented fingers, touches aligned in one 45 degree axis will yield a single peak and touches oriented in the opposite 45 degree axis will yield two peaks. The 45 degree axis assumes that the pitches in both axes are equal; otherwise, the angle may be defined by the arctangent of PitchX over PitchY, where PitchX and PitchY are the respective pitches in the X axis and Y axis. By taking the measurements in the four peak-detection weighting schemes 402-408, it is possible to find two independent touches for a given two-finger diagonal orientation. Additionally, if peaks can be selected from each of the four peak-detection weighting schemes 402-408 separately, it is possible to extract two distinct finger locations with two touches placed in any orientation as long as there is an appropriate selection scheme. The peak-detection weighting algorithm 400 can generate a list of possible peaks from the four peak-detection weighting schemes 402-408. These schemes could also be considered four separate searches for a peak.

The peak-detection weighting algorithm 400 also has the ability to choose an appropriate peak from a list of possible peaks from the four peak-detection schemes. Two selection methods are presented below, namely 1) furthest distance selection method; and 2) peak-detection weighting method.

In one embodiment, the furthest distance method takes all possible peaks that were found during the four peak-detection weighting schemes 402-408 and finds the two possible peaks that are the furthest apart. This technique works well because it is simple to understand and should provide good interpolation data for the higher granularity calculation of the finger position. However, it should be noted that this adds additional computations for the distance calculations. This method may also be static compared to the peak-detection weighting method, which may be more dynamic.

In another embodiment, the peak weighting method allows for a dynamic switching of difficulty. For example, when peaks are converging the algorithm can be more relaxed and assume there are more likely two peaks (e.g., if there were two peaks before there are probably two peaks now). For initial touch down (i.e., initial detection of a touch), the algorithm can be more difficult to pass as two peaks to reduce the number of failures where a single large touch is interpreted as two peaks. The method for determining the peak weight is illustrated and described with respect to FIG. 5.

Figure 5:
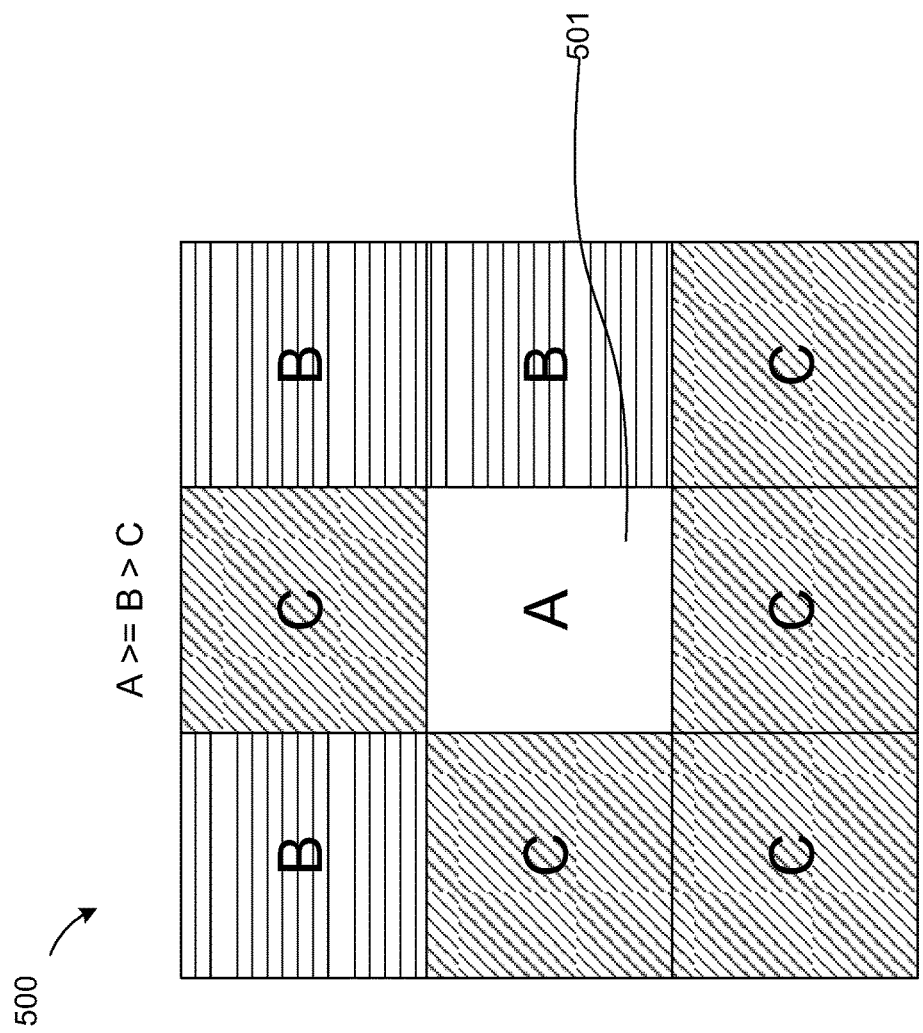
FIG. 5 illustrates exemplary data to evaluate peak-detection weighting according to one embodiment.

FIG. 5 illustrates exemplary data to evaluate peak-detection weighting according to one embodiment. The basic premise is that for each of the four peak-detection weighting schemes 402-408, there are eight checks, comparing the cell value of the center cell 401 with the cell values of the adjacent cells. The peak-detection weighting algorithm 400 counts the number of check that succeeds. For example, in the standard peak detection algorithm 200 of FIG. 2, all eight checks need to be successful to detect a peak. The peak-detection weighting algorithm 400 can set the peak weight threshold dynamically, such as at eight or even a lower number. For example, allowing peaks to be detected at seven of eight (7/8) passing conditions, the peak-detection weighting algorithm 400 allows for a higher likelihood of detecting the peak.

Returning back to FIG. 5, running the peak-detection weighting algorithm 400 against the cell values in FIG. 5 results in choosing the lower-left-weighting scheme 406 as the peak because it has the most passing conditions. In this embodiment, the peak-detection weighting algorithm 400 processes data of a capacitive map (also referred to as a capacitive image) using a 3×3 window 500, which includes nine cells centered above a center cell 501. The cells values of the cells are A is greater than or equal to B, and B is greater than C. The actual results are:

| | |
|---|---|
| Upper-Left Weighting | 5 |
| Upper-Right Weighting | 5 |
| Lower Right Weighting | 7 |
| Lower Left Weighting | 8 |

Of course, other cell values may be used and may result in peaks being selected from one of the other different peak-detection weighting schemes 402,404,408. FIGS. 8-11 illustrate four examples of exemplary data to evaluate peak-detection weighting.

The peak-detection weighting algorithm 400 allows for significantly better finger separation when two or more fingers are on a touchscreen or other touch device. This is especially true for converging fingers where the number of fingers prior to convergence has been well established. In one embodiment, the symmetry can be used to take up to sixteen measurements, instead of eight, to establish four possible peaks per intersection, as well as using a peak weighting scheme to establish the strength and likelihood a detected peak is really a valid touch. In one embodiment, the algorithm takes sixteen measurements. In a further embodiment, a more sophisticated algorithm could be implemented to reduce redundancy, making the average number of measurements closer to twelve even though the worst case may still be sixteen measurements. For example, if the check "greater than and equal to" fails, then don't try the check "greater than."

In one embodiment, the peak-detection weighting algorithm 400 processes a capacitive map or a capacitive image from a touchscreen or touchpad device. The data is processed to find a "peak" from which the location of the finger touch can be determined, processed and sent to the host.

In other embodiments, not all permutations need to be taken. For example, choosing any of the directions, such as upper, lower, left, or right), and taking both measurements, such as upper left and upper right, yields good improvements over conventional solutions because it provides a sample around both of the 45 degree axes. Then instead of using the peak-detection weighting selection, the further distance selection method could be used for choosing the best peak. The furthest distance selection method is described below with respect to FIG. 6. It should also be noted that the peak-detection weighting method still works for a partial usage of the upper-left and upper-right weighting schemes.

Figure 6:
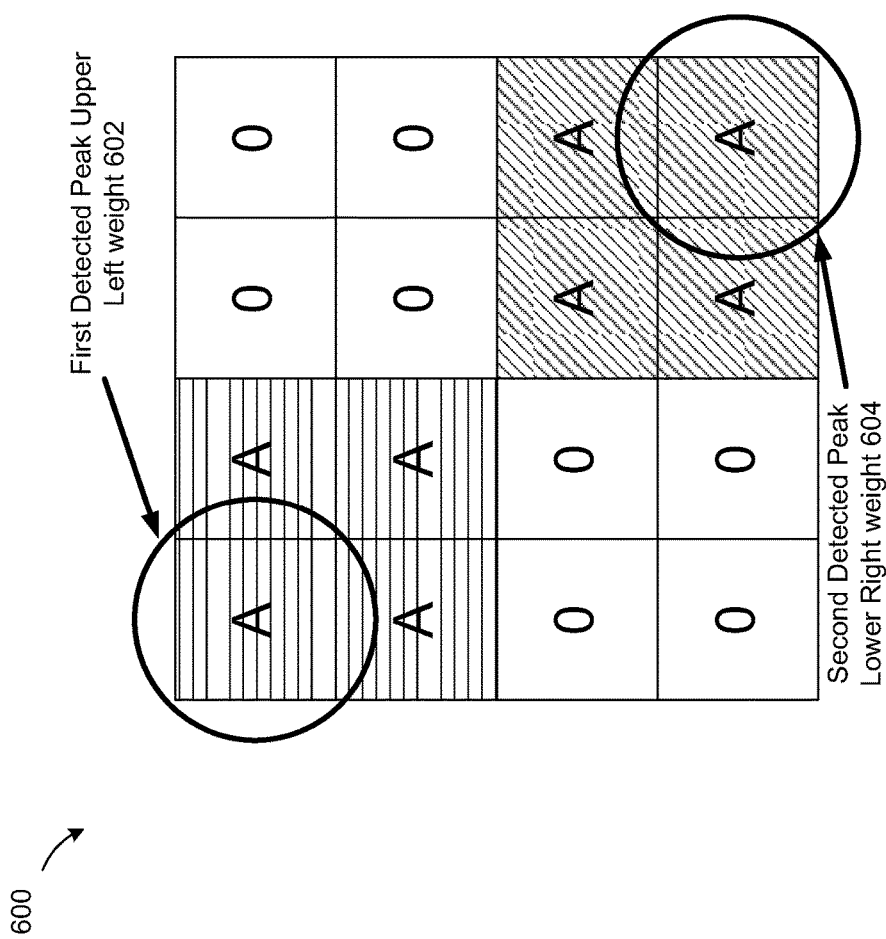
FIG. 6 illustrates a furthest distance selection method according to one embodiment.

FIG. 6 illustrates a furthest distance selection method according to one embodiment. A capacitive map 600 includes a 4×4 grid of cells. The peak-detection algorithm may determine there are multiple possible peaks. As shown in FIG. 6, there are four possible peaks detected in the upper left corner and four possible peaks detected in the lower right corner of the capacitive map 600. In this embodiment, it is assumed that at least the upper-left-weighting scheme and the lower-right-weighting scheme have been performed to determine a first detected peak 602 with the upper-left-weighting scheme and a second detected peak 604 with the lower-right-weighting scheme. In other embodiments, two or more different combinations of schemes may be performed, or even all four weighting schemes may be performed. The furthest distance selection method determines a distance between the different possible peaks and determines that the first detected peak 602 and the second detected peak 604 are the farthest apart, and these two detected peaks are selected as valid peaks.

Similar to the embodiments of the peak-detection weighting embodiments, this selection method is flexible. For example, one could take fewer measurements to evaluate possible peaks or have a lower/higher threshold for a valid peak. This flexibility can dynamically change the complexity and execution of the algorithm based on situational needs. For example, the initial touch down might use a less aggressive algorithm because there is not any strong evidence supporting two touches versus one large touch. However, if two touches have already been established then this algorithm can be set to be more aggressive.

Other algorithms, which have a natural non-symmetry to them, which can be easily shifted to produce a second measurement, could be used similar to this idea. For example the decision to use edge correction virtual sensors or not is likely a non-symmetric algorithm. Using this, a judgment can more reliably be made if a finger is on the edge of the sensor pattern or not.

The embodiments described herein may also affect how the baseline is calculated. A low peak weight number is likely to have touches in between intersections (between sense elements). Therefore, thresholds can be adjusted for higher accuracy (such as the Noise Threshold and Centroid Threshold). This would potentially increase the detection accuracy as well as the high level interpolation accuracy because minimal data is wasted.

Embodiments of the peak-detection algorithm are intended to improve accuracy of a non-symmetric measurement. These embodiments solve a major problem of correctly detecting closely spaced touches. This may be important for various reasons, but firstly, new specifications for devices, such as a device running Windows8, developed by Microsoft Corporation, may start to expect performance for converging touches to be 0 mm separation. That is, two fingers touching should not be confused by a single large finger if the two fingers were previously converging. Secondly, customer evaluations and customer demos use finger separation as a benchmark for algorithm quality. So, improving this also improves the sell-ability of a device using these embodiments.

Figure 7:
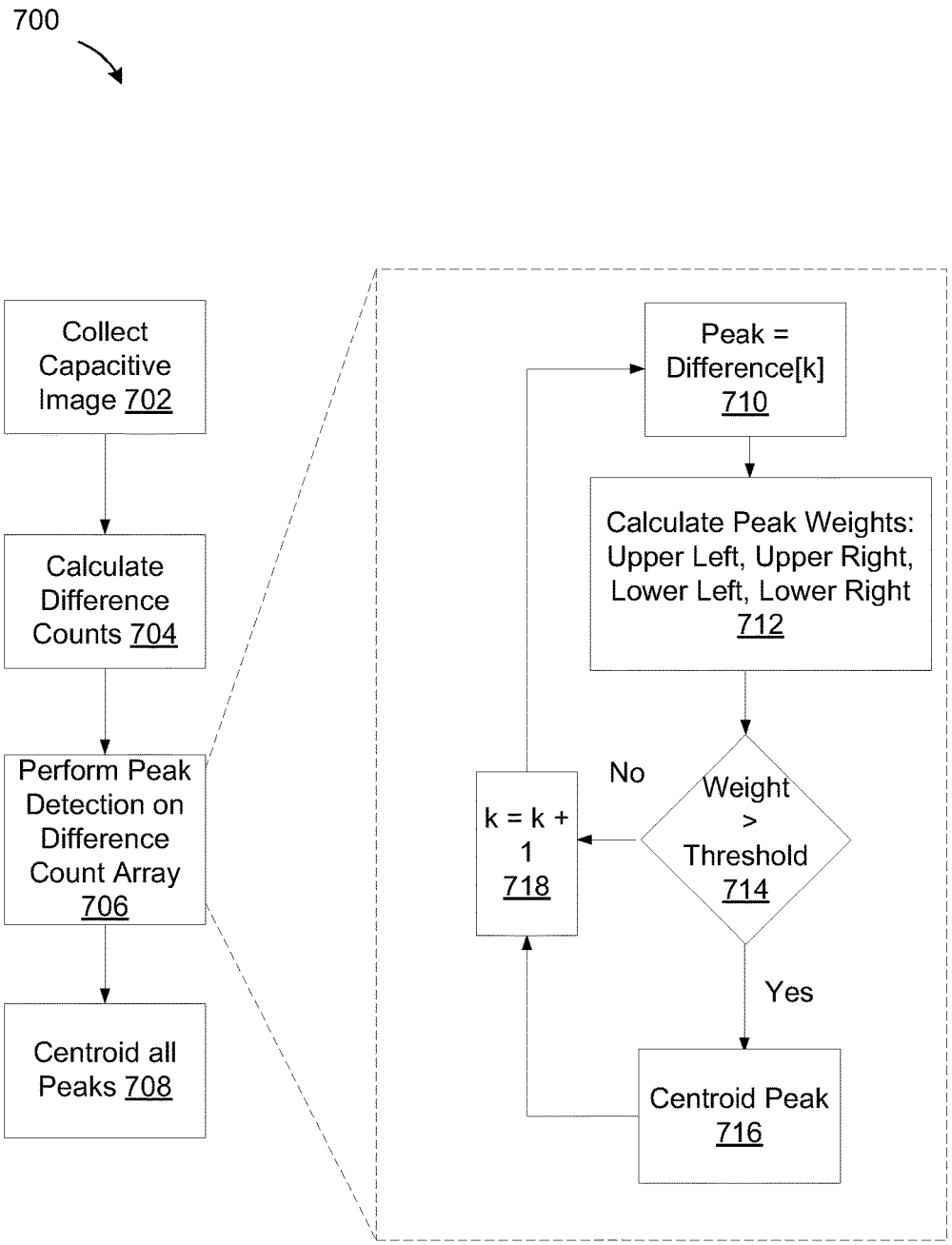
FIG. 7 is a flow diagram of a method of peak-detection weighting for determining actual peaks according to an embodiment.

FIG. 7 is a flow diagram of a method 700 of peak-detection weighting for determining actual peaks according to an embodiment. The method 700 may be performed by processing logic that may comprise hardware (circuitry, dedicated logic, etc.), software (such as is run on a general purpose computing system or a dedicated machine), firmware (embedded software), or any combination thereof. In one embodiment, the processing device 110 performs the method 700. In another embodiment, the peak detector 120 performs the method 700. Alternatively, other components of the electronic system 100 perform some or all of the operations of method 700.

Referring to FIG. 7, the method 700 begins with collecting a capacitive image (block 702). The capacitive image may include multiple cell values representation the capacitances of the intersections of a capacitive sense array. The processing logic calculates the different counts (block 704), which are the differences between the raw counts of the intersections and the baselines of the intersections. In another embodiment, the processing logic receives the different counts from a different circuit or routing executing on the processing device. The processing logic performs peak detection on the difference count array (block 706), and determines coordinates using the peaks (block 708) detected at block 706.

In the depicted embodiment, the processing logic performs the peak detection at block 706 by defining a first center cell as the peak (block 710) and calculating the peak weights for this cell using two, three, or four of the peak-detection schemes (e.g., 402-408) (block 712). The processing logic determines whether each of the peak weights is above a threshold value (block 714) (e.g., 7 or 8). If the peak weight for a possible peak exceeds the threshold at block 714, the processing logic selects this as a valid peak (block 716), and increments the count to select the next cell as the peak (block 718). However, if at block 714, the peak weight for a possible peak is less than the threshold, the processing logic just increments the count to select the next cell as the peak (block 718).

In another embodiment of the method, the processing logic measures touch data on a sense array, the touch data represented as multiple cells, such as cells of an array. The processing logic performs multiple different peak-detection schemes on each of the multiple cells to generate a list of one or more possible peaks in the touch data. The processing logic selects one or more actual peaks from the list one or more possible peaks. The one or more actual peaks are used to determine a location of a touch proximate to the sense array.

In a further embodiment, the sense array is a capacitive sense array, and each of the multiple cells includes a capacitance value of an intersection of sense elements in the capacitive sense array. In another embodiment, the sense array is an optical sense array, and the cell values represent the values measured by an optical sensing device. Alternatively, the peak detection embodiments described herein may be used in other sensing systems, such as, for example, a system that creates a digitized heat map using reflected light.

In another embodiment, the processing logic selects the one or more actual peaks by selecting the single peak as the one or more actual peaks when the list comprises a single peak, and selecting two of the two or more peaks that are the farthest apart as the one or more actual peaks when the list comprises two or more peaks.

In another embodiment, the processing logic selects the one or more actual peaks by selecting the single peak as the one or more actual peaks when the list comprises a single peak, and, when the list comprises two or more peaks, calculating a peak weight for each of the different peak-detection schemes, and selecting each of the two or more peaks whose peak weight is greater than a threshold value as the one or more actual peaks. The processing logic may select the one or more actual peaks by selecting a peak having a highest peak weight for each of the multiple cells.

In another embodiment, the processing logic performs, for each of the different peak-detection schemes, multiple peak-detection checks for each of the multiple cells, and counts a number of successful checks for the multiple peak-detection checks. The number of successful checks is a peak weight for the respective scheme. In one embodiment, the processing logic performs eight measurements for each of the cells for each of the different schemes. In another embodiment, the processing logic performs sixteen measurements for all of the different schemes. In another embodiment, the processing logic performs twelve measurements for all the different schemes using the symmetry of the schemes to leverage previous measurements used for different schemes. In another embodiment, for each of the multiple cells, the processing logic takes twelve peak-detection measurements to establish four possible peaks for the respective cell. The processing logic calculates a peak weight for each of an upper-left-weighting scheme, an upper-right-weighting scheme, a lower-left-weighting scheme and a lower-right-weighting scheme using the twelve peak-detection measurements. The peak weight may represent a strength and likelihood of the respective peak being a valid touch. The processing logic selects the one of the four possible peaks for the respective cell with the highest peak weight.

In another embodiment, the method includes obtaining a capacitive image of a capacitive sense array. The capacitive image includes multiple cells each with a capacitance value of an intersection of sense elements of the capacitive sense array. The processing logic performs a first set of peak-detection checks for each of the multiple cells using a first peak-detection scheme to identify possible peaks. The processing logic performs a second set of peak-detection checks for each of the multiple cells using a second peak-detection scheme to identify additional possible peaks. The processing logic determines which of the possible peaks and additional possible peaks are valid peaks. The valid peaks may be used to determine locations of actual touches proximate to the capacitive sense array.

In a further embodiment, the first peak-detection scheme is one of an upper-left-weighting scheme, an upper-right-weighting scheme, a lower-left-weighting scheme, and a lower-right-weighting scheme, and the second peak-detection scheme is another one of the upper-left-weighting scheme, the upper-right-weighting scheme, the lower-left-weighting scheme, and the lower-right-weighting scheme.

In a further embodiment, the processing logic performs a third set of peak-detection checks for each of the multiple cells using a third peak-detection scheme to identify a third set of additional possible peaks. In a further embodiment, the processing logic performs a fourth set of peak-detection checks for each of the multiple cells using a fourth peak-detection scheme to identify a fourth set of additional possible peaks.

In another embodiment, the processing logic performs the first set of peak-detection checks by identifying a 3×3 window centered at the respective cell, and comparing a cell value of the respective cell against cell values of adjacent cells in the 3×3 window. The window can then be shifted to be centered at a next cell until some or all cells have been checked. In another embodiment, the processing logic performs the first set of peak-detection checks for each of the multiple cells by identifying a 3×3 window centered at the respective cell. The processing logic determines if a cell value is greater than a first set of adjacent cells in the 3×3 widow, and determines if the cell value is greater than or equal to a second set of adjacent cells in the 3×3 window.

The methods described above regarding peak detection can be implemented by the peak detector 120, which may be implemented in a capacitive touch screen controller. In one embodiment, the capacitive touch screen controller is the TrueTouch® capacitive touchscreen controllers, such as the CY8CTMA3xx family of TrueTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touch-screens, supports leading operating systems, and is optimized for low-power multi-touch gesture and all-point touchscreen functionality. Alternatively, the touch position calculation features may be implemented in other touch-screen controllers, or other touch controllers of touch-sensing devices. In one embodiment, the touch position calculation features may be implemented with other touch filtering algorithms as would be appreciated by one of ordinary skill in the art having the benefit of this disclosure.

The embodiments described herein may be used in various designs of mutual capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

FIGS. 8-12 illustrate four examples of exemplary data to evaluate peak-detection weighting. The four examples have the same data for a 4×4 grid and a 3×3 window is used to detect peaks. In the first example of FIG. 8, the window is in the top left corner and the four peak-detection schemes are computed and weighted as described herein. In this example, the upper-left weighting has the highest peak weight of eight. In the second example of FIG. 9, the window is shifted to the upper right corner and the four peak-detection schemes are computed and weighted as described herein. In this example, the upper-right weighting has the highest peak weight of eight. In the third example of FIG. 10, the window is in the bottom left corner and the four peak-detection schemes are computed and weighted as described herein. In this example, all four schemes have a peak weight of five. In the fourth example of FIG. 11, the window is in the bottom right corner and the four peak-detection schemes are computed and weighted as described herein. In this example, the lower-left weighting and the lower-right weighting have the highest peak weight of eight.

In one embodiment, the peaks can be selected as all possible peaks having a weight of eight. In another embodiment, the peaks can be selected as the peaks having a weight above a threshold, such as seven or even lower. In another embodiment, the peaks can be selected as the highest weight for the four schemes as describe herein. Alternatively, other selection methods can be used to select actual switches.

In a simulation to evaluate different peak weights and the failure rates, a lower peak weight tolerance than the standard peak-detection algorithm resulted in a lower failure rate from a two-finger detection standpoint. The assumption is that the two fingers are converging and there is high confidence that there are actually two touches on the screen. That is, low values of peak weight tolerance may produce a different failure in which two touches are interpreted as one. For example, the failure rates versus finger separation distance for the peak weights of 7 and 6 for the peak-detection weighting embodiments described herein were lower than the standard peak-detection failure rates versus finger separation distance where the peak weight is 8.

Figure 12:
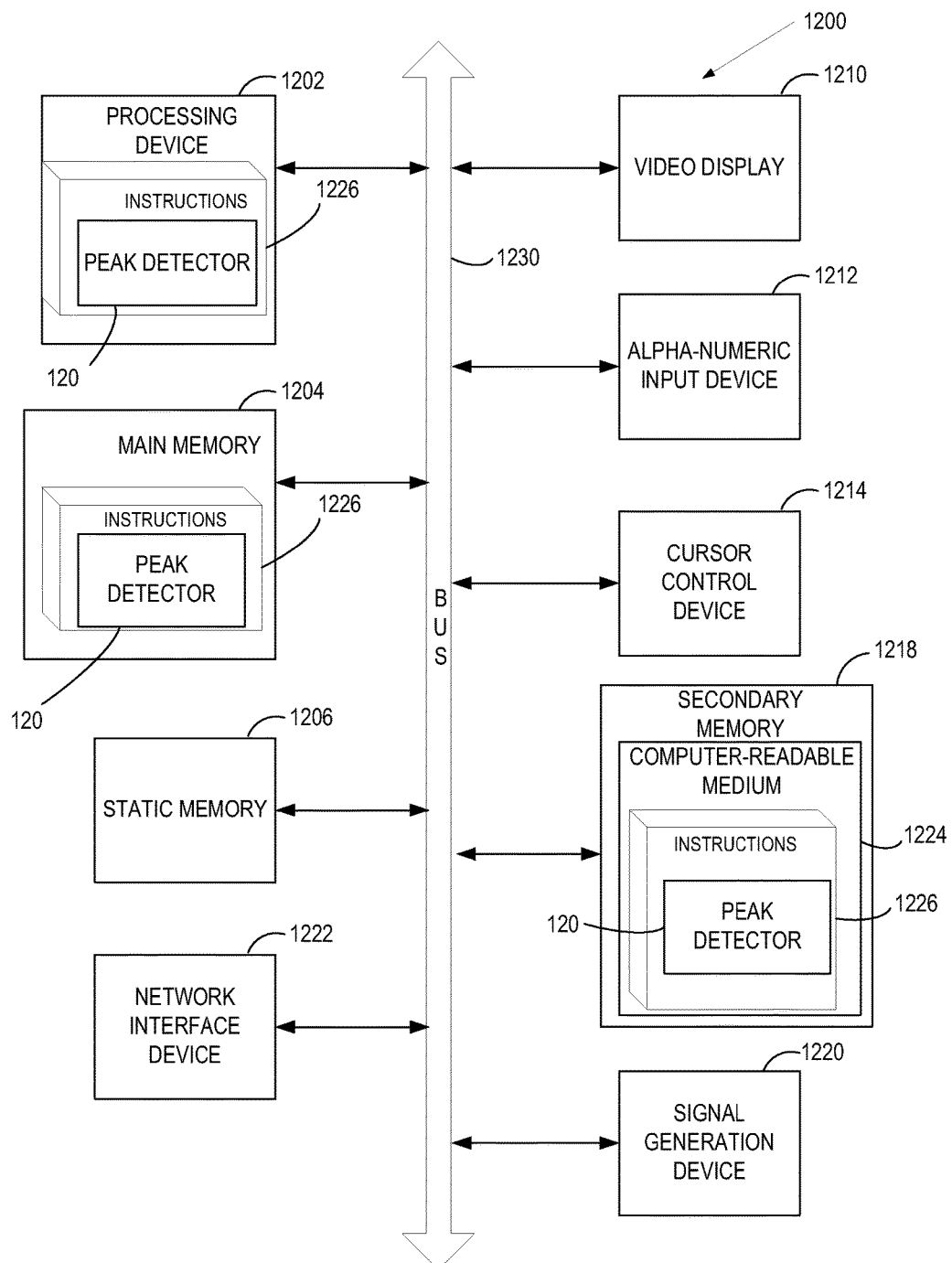
FIG. 12 is a diagram of one embodiment of a computer system for peak-detection weighting.

FIG. 12 is a diagram of one embodiment of a computer system for peak detection. Within the computer system 1200 is a set of instructions for causing the machine to perform any one or more of the methodologies discussed herein. In alternative embodiments, the machine may be connected (e.g., networked) to other machines in a LAN, an intranet, an extranet, or the Internet. The machine can be a host in a cloud, a cloud provider system, a cloud controller or any other machine. The machine can operate in the capacity of a server or a client machine in a client-server network environment, or as a peer machine in a peer-to-peer (or distributed) network environment. The machine may be a personal computer (PC), a tablet PC, a console device or set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 1200 includes a processing device 1202 (e.g., host processor 150 or processing device 110 of FIG. 1), a main memory 1204 (e.g., read-only memory (ROM), flash memory, dynamic random access memory (DRAM) such as synchronous DRAM (SDRAM) or DRAM (RDRAM), etc.), a static memory 1206 (e.g., flash memory, static random access memory (SRAM), etc.), and a secondary memory 1218 (e.g., a data storage device in the form of a drive unit, which may include fixed or removable computer-readable storage medium), which communicate with each other via a bus 1230.

Processing device 1202 represents one or more general-purpose processing devices such as a microprocessor, central processing unit, or the like. More particularly, the processing device 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. Processing device 1202 is configured to execute the instructions 1226 for performing the operations and steps discussed herein.

The computer system 1200 may further include a network interface device 1222. The computer system 1200 also may include a video display unit 1210 (e.g., a liquid crystal display (LCD) or a cathode ray tube (CRT)) connected to the computer system through a graphics port and graphics chipset, an alphanumeric input device 1212 (e.g., a keyboard), a cursor control device 1214 (e.g., a mouse), and a signal generation device 1220 (e.g., a speaker).

The secondary memory 1218 may include a machine-readable storage medium (or more specifically a computer-readable storage medium) 1224 on which is stored one or more sets of instructions 1226 embodying any one or more of the methodologies or functions described herein. In one embodiment, the instructions 1226 include instructions for the peak detector 120. The instructions 1226 may also reside, completely or at least partially, within the main memory 1204 and/or within the processing device 1202 during execution thereof by the computer system 1200, the main memory 1204 and the processing device 1202 also constituting machine-readable storage media.

The computer-readable storage medium 1224 may also be used to store the instructions 1226 persistently. While the computer-readable storage medium 1224 is shown in an exemplary embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media.

The instructions 1226, components and other features described herein can be implemented as discrete hardware components or integrated in the functionality of hardware components such as ASICS, FPGAs, DSPs or similar devices. In addition, the instructions 1226 can be implemented as firmware or functional circuitry within hardware devices. Further, the instructions 1226 can be implemented in any combination of hardware devices and software components.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method of determining locations of touches on a touch sense array, comprising:
   obtaining capacitance values for a plurality of cells of the touch sense array;
   for each cell of a subset of the plurality of cells:
      identifying a respective set of cells surrounding the respective cell;
      identifying a plurality of different peak-detection schemes for the respective cell and the respective set of surrounding cells, wherein each peak-detection scheme partitions the respective set of surrounding cells into a respective first subset and a respective second subset;
      for each surrounding cell in the respective set of surrounding cells:
         performing a first operation to determine whether the capacitance value of the respective cell is greater than the capacitance value of the respective surrounding cell; and
         performing a second operation to determine whether the capacitance value of the respective cell is greater than or equal to the capacitance value of the respective surrounding cell; and
      designating the respective cell as a peak according to a respective peak-detection scheme in accordance with (1) the performed first operations for the respective first subset and in accordance with (2) the performed second operations for the respective second subset; and
   selecting one or more peaks from the designated peaks and determining a respective location of a respective touch proximate to the touch sense array corresponding to each of the selected one or more peaks.

2. The method of claim 1, wherein the capacitance value of the respective cell is equal to the respective capacitance value of at least one surrounding cell in the respective second subset.

3. The method of claim 1, wherein for each cell of the subset of the plurality of cells, the respective surrounding cells consist of cells in the touch sense array that are adjacent to the respective cell.

4. The method of claim 1, wherein each capacitance value measures capacitance at an intersection of sense elements in the touch sense array.

5. The method of claim 1, wherein selecting the one or more peaks comprises:
   when the designated peaks comprise a single peak, selecting the single peak as the one or more peaks; and
   when the designated peaks comprise two or more peaks, selecting two of the two or more peaks that are the farthest apart as the one or more peaks.

6. The method of claim 1, wherein the selecting the one or more peaks comprises:
   when the designated peaks comprise a single peak, selecting the single peak as the one or more peaks; and
   when the designated peaks comprise two or more peaks, calculating a peak weight for each of the plurality of different peak-detection schemes, and
   selecting each of the two or more peaks whose peak weight is greater than a threshold value as the one or more peaks.

7. The method of claim 1, further comprising, for each cell of the subset, computing a peak weight comprising a count of distinct peak-detection schemes designating the respective cell as a peak.

8. The method of claim 1, wherein the plurality of different peak-detection schemes comprises an upper-left-weighting scheme, an upper-right-weighting scheme, a lower-left-weighting scheme and a lower-right-weighting scheme.

9. The method of claim 7, wherein selecting the one or more peaks comprises selecting a peak having a highest peak weight among the plurality of cells.

10. An apparatus comprising:

a memory device;

a touch sense array; and a processing device coupled to the memory device and the touch sense array, wherein the processing device is configured by one or more programs stored in the memory device for:

obtaining capacitance values for a plurality of cells of the touch sense array;

for each cell of a subset of the plurality of cells:

identifying a respective set of cells surrounding the respective cell;

identifying a plurality of different peak-detection schemes for the respective cell and the respective set of surrounding cells, wherein each peak-detection scheme partitions the respective set of surrounding cells into a respective first subset and a respective second subset;

for each surrounding cell in the respective set of surrounding cells:

performing a first operation to determine whether the capacitance value of the respective cell is greater than the capacitance value of the respective surrounding cell; and performing a second operation to determine whether the capacitance value of the respective cell is greater than or equal to the capacitance value of the respective surrounding cell; and designating the respective cell as a peak according to a respective peak-detection scheme in accordance with (1) the performed first operations for the respective first subset and in accordance with (2) the performed second operations for the respective second subset; and selecting one or more peaks from the designated peaks and determining a respective location of a respective touch proximate to the touch sense array corresponding to each of the selected one or more peaks.

11. The method of claim 1, wherein each capacitance value is computed as a difference between a respective raw capacitance value and a respective baseline capacitance value.

12. The apparatus of claim 10, wherein for each cell of the subset of the plurality of cells, the respective surrounding cells consist of cells in the touch sense array that are adjacent to the respective cell.

13. The apparatus of claim 10, wherein each capacitance value measures capacitance at an intersection of sense elements in the touch sense array.

14. The apparatus of claim 10, wherein selecting the one or more peaks comprises:

when the designated peaks comprise a single peak, selecting the single peak as the one or more peaks; and when the designated peaks comprise two or more peaks, selecting two of the two or more peaks that are the farthest apart as the one or more peaks.

15. The apparatus of claim 10, wherein the selecting the one or more peaks comprises:

when the designated peaks comprise a single peak, selecting the single peak as the one or more peaks; and when the designated peaks comprise two or more peaks, calculating a peak weight for each of the plurality of different peak-detection schemes, and selecting each of the two or more peaks whose peak weight is greater than a threshold value as the one or more peaks.

16. The apparatus of claim 10, further comprising, for each cell of the subset, computing a peak weight comprising a count of distinct peak-detection schemes designating the respective cell as a peak.

17. The apparatus of claim 10, wherein the plurality of different peak-detection schemes comprises an upper-left-weighting scheme, an upper-right-weighting scheme, a lower-left-weighting scheme and a lower-right-weighting scheme.

18. The apparatus of claim 16, wherein selecting the one or more peaks comprises selecting a peak having a highest peak weight among the plurality of cells.

19. The method of claim 1, wherein the designated peaks include two peaks corresponding to two distinct cells, and the two distinct cells are designated as the two peaks according two distinct peak-detection schemes.

20. A non-transitory computer readable storage medium storing one or more programs, the one or more programs comprising instructions, which when executed by a processing device, cause the processing device to:

obtain capacitance values for a plurality of cells of a touch sense array;

for each cell of a subset of the plurality of cells:

identify a respective set of cells surrounding the respective cell;

identifying a plurality of different peak-detection schemes for the respective cell and the respective set of surrounding cells, wherein each peak-detection scheme partitions the respective set of surrounding cells into a respective first subset and a respective second subset;

for each surrounding cell in the respective set of surrounding cells:

performing a first operation to determine whether the capacitance value of the respective cell is greater than the capacitance value of the respective surrounding cell; and performing a second operation to determine whether the capacitance value of the respective cell is greater than or equal to the capacitance value of the respective surrounding cell; and designating the respective cell as a peak according to a respective peak-detection scheme in accordance with (1) the performed first operations for the respective first subset and in accordance with (2) the performed second operations for the respective second subset; and select one or more peaks from the designated peaks and determining a respective location of a respective touch proximate to the touch sense array corresponding to each of the selected one or more peaks.

* * * * *